US007097755B2

(12) United States Patent
Basol et al.

(10) Patent No.: US 7,097,755 B2
(45) Date of Patent: Aug. 29, 2006

(54) ELECTROCHEMICAL MECHANICAL PROCESSING WITH ADVANCIBLE SWEEPER

(75) Inventors: Bulent M. Basol, Manhattan Beach, CA (US); Halit N. Yakupoglu, Corona, CA (US); Cyprian E. Uzoh, San Jose, CA (US); Homayoun Talieh, San Jose, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 220 days.

(21) Appl. No.: 10/288,558

(22) Filed: Nov. 4, 2002

(65) Prior Publication Data

US 2003/0106807 A1   Jun. 12, 2003

Related U.S. Application Data

(60) Continuation-in-part of application No. 09/740,701, filed on Dec. 18, 2000, now Pat. No. 6,534,116, and a continuation-in-part of application No. 09/607,567, filed on Jun. 29, 2000, now Pat. No. 6,676,822, which is a division of application No. 09/201,929, filed on Dec. 1, 1998, now Pat. No. 6,176,992.

(60) Provisional application No. 60/350,214, filed on Nov. 2, 2001, provisional application No. 60/224,739, filed on Aug. 10, 2000.

(51) Int. Cl.
*C25D 5/00* (2006.01)
*C25F 3/00* (2006.01)

(52) U.S. Cl. .................. 205/93; 204/206; 204/207; 204/209; 204/224 R; 204/224 M; 205/137; 205/148; 205/662; 205/668; 205/671; 205/686

(58) Field of Classification Search ........... 204/224 M, 204/224 R, 206, 207, 209; 205/137, 148, 205/662, 668, 671, 686, 93
See application file for complete search history.

(56) References Cited

U.S. PATENT DOCUMENTS

| | | | | | |
|---|---|---|---|---|---|
| 3,990,959 | A | * | 11/1976 | Payne et al. ................. | 205/654 |
| 4,772,361 | A | * | 9/1988 | Dorsett et al. ................ | 205/93 |
| 4,921,583 | A | * | 5/1990 | Sewell et al. ................ | 205/129 |
| 5,372,699 | A | * | 12/1994 | Rischke et al. ............. | 205/129 |
| 5,882,498 | A | * | 3/1999 | Dubin et al. ................. | 205/261 |
| 5,968,333 | A | * | 10/1999 | Nogami et al. ............. | 205/184 |
| 6,176,992 | B1 | | 1/2001 | Talieh .......................... | 205/87 |
| 6,241,583 | B1 | | 6/2001 | White .......................... | 451/41 |

FOREIGN PATENT DOCUMENTS

| | | |
|---|---|---|
| WO | WO 02/29859 | 4/2002 |
| WO | WO 02/057514 | 7/2002 |
| WO | WO 03/028048 A2 | 4/2003 |

* cited by examiner

*Primary Examiner*—Roy King
*Assistant Examiner*—William T. Leader
(74) *Attorney, Agent, or Firm*—Knobbe, Martens, Olson & Bear LLP (57) ABSTRACT

The present invention provides an apparatus for electrochemical mechanical processing of a surface of a workpiece by utilizing a process solution. The apparatus of the present invention includes an electrode touching the process solution, a belt workpiece surface influencing device extended between a supply spool and a receiving spool. During the process, the surface of the workpiece is placed in proximity of the workpiece surface influencing device and the process solution is flowed through the process section and onto the surface while a potential difference is applied between the electrode and the surface of the workpiece.

45 Claims, 10 Drawing Sheets

ELECTROCHEMICAL MECHANICAL PROCESSING WITH ADVANCIBLE SWEEPER

RELATED APPLICATIONS

This application claims priority from U.S. Prov. Appln. No. 60/350,214 filed Nov. 2, 2001 and is a continuation-in-part of U.S. Ser. No. 09/607,567 filed Jun. 29, 2000 now U.S. Pat. No. 6,676,822 which is a divisional of U.S. Ser. No. 09/201,929 filed Dec. 1, 1998 now U.S. Pat. No. 6,176,992, and is a continuation in part of U.S. Ser. No. 09/740,701 filed Dec. 18, 2000 claiming priority to U.S. Prov. No. 60/224,739 filed Aug. 10, 2000.

FIELD

The present invention generally relates to semiconductor integrated circuit technology and, more particularly, to a device for electrotreating or electrochemically processing a workpiece.

BACKGROUND

Conventional semiconductor devices such as integrated circuits (IC) generally comprise a semiconductor substrate, usually a silicon substrate, and a plurality of conductive material layers separated by insulating material layers. Conductive material layers, or interconnects, form the wiring network of the integrated circuit. Each level of conductor in the wiring network is isolated from the neighboring level of conductors by the insulating layers, also known as interlayer dielectrics. One dielectric material that is commonly used in silicon integrated circuits is silicon dioxide, although there is now a trend to replace at least some of the standard dense silicon dioxide material in IC structures with low-k dielectric materials such as organic, inorganic, spin-on and CVD candidates. Conventionally, IC interconnects are formed by filling a conductor such as copper in features or cavities etched into the dielectric interlayers by a metallization process. Copper is becoming the preferred conductor for interconnect applications because of its low electrical resistance and good electromigration property. The preferred method of copper metallization process is electroplating. In an integrated circuit, multiple levels of interconnect networks laterally extend with respect to the substrate surface. Interconnects formed in sequential layers can be electrically connected using features such as vias or contacts. In a typical interconnect fabrication process; first an insulating layer is formed on the semiconductor substrate, patterning and etching processes are then performed to form features or cavities such as trenches, vias, and pads etc., in the insulating layer. Then, copper is electroplated to fill all the features. In such electroplating processes, the wafer is placed on a wafer carrier and a cathodic (−) voltage with respect to an electrode is applied to the wafer surface while the electrolyte solution wets both the wafer surface and the electrode.

Once the plating is over, a material removal step such as a chemical mechanical polishing (CMP) process step is conducted to remove the excess copper layer, which is also called copper overburden, from the top surfaces (also called the field region) of the workpiece leaving copper only in the features. An additional material removal step is then employed to remove the other conductive layers such as the barrier/glue layers that are on the field region. Fabrication in this manner results in copper deposits within features that are physically as well as electrically isolated from each other. Other conventional etching techniques can also be used, and conventional approaches exist that can remove both copper and the barrier/glue layers from the field region in one step. A particular type of CMP apparatus that works effectively is described in U.S. Pat. No. 6,103,628 entitled Reverse Linear Polisher with Loadable housing.

The adverse effects of conventional material removal technologies may be minimized or overcome by employing a planar deposition approach that has the ability to provide thin layers of planar conductive material on the workpiece surface, as well as planar removal processes. These planar deposition and removal processes also have application in thru-resist processes employed in IC packaging. In these applications plating is performed into holes opened in resist layers onto seed films exposed on the bottom of each hole or opening.

One technique is collectively referred to as Electrochemical Mechanical Processing (ECMPR), which term is used to include both Electrochemical Mechanical Deposition (ECMD) processes as well as Electro (ECME), and also called Electrochemical Mechanical Polishing. It should be noted that in general both ECMD and ECME processes are referred to as electrochemical mechanical processing (ECMPR) since both involve electrochemical processes and mechanical action.

In one aspect of an ECMPR process, a workpiece surface influencing device (WSID) such as a mask, pad or a sweeper is used during at least a portion of the electrotreatment process when there is physical contact or close proximity and relative motion between the workpiece surface and the WSID. Descriptions of various planar deposition and planar etching methods and apparatus can be found in the following patents and pending applications, all commonly owned by the assignee of the present invention. U.S. Pat. No. 6,176,992 entitled, Method and Apparatus for Electrochemical Mechanical Deposition. U.S. application Ser. No. 09/740,701 entitled, Plating Method and Apparatus that Creates a Differential Between Additive Disposed on a Top Surface and a Cavity Surface of a Workpiece Using an External Influence, filed on Dec. 18, 2001, and U.S. application Ser. No. 09/961,193, filed on September 20, entitled, Plating Method and Apparatus for Controlling Deposition on Predetermined Portions of a Workpiece. These methods can deposit metals in and over cavity sections on a workpiece in a planar manner. They also have the capability of yielding novel structures with excess amount of metals over the features irrespective of their size, if desired.

In ECMD methods, the surface of the workpiece is wetted by the electrolyte and is rendered cathodic with respect to an electrode, which is also wetted by the electrolyte. This typically results in conductive material deposition within the features of the workpiece, and a thin layer on the top surface of the workpiece. During ECMD, the wafer surface is pushed against or in close proximity to the surface of the WSID or vice versa when relative motion between the surface of the workpiece and the WSID results in sweeping of the workpiece surface. Planar deposition is achieved due to this sweeping action as described in the above-cited patent applications.

In ECME methods, the surface of the workpiece is wetted by the electrolyte or etching solution, but the polarity of the applied voltage is reversed, thus rendering the workpiece surface more anodic compared to the electrode. If no voltage difference is applied, the etching is chemical etching and can be performed when there is physical contact or close proximity between the workpiece and the WSID. The chemical etching can be carried out using the process solution or an etching solution.

Very thin planar deposits can be obtained by first depositing a planar layer using an ECMD technique and then using an ECME technique on the planar film in the same electrolyte by reversing the applied voltage. Alternately the ECME step can be, carried out in a separate machine and a different etching electrolyte. The thickness of the deposit may be reduced in a planar manner. In fact, an ECME technique may be continued until all the metal on the field regions is removed. It should be noted that a WSID may or may not be used during the electroetching or etching process since substantially planar etching can be achieved with or without the use of WSID.

Figure 1A:
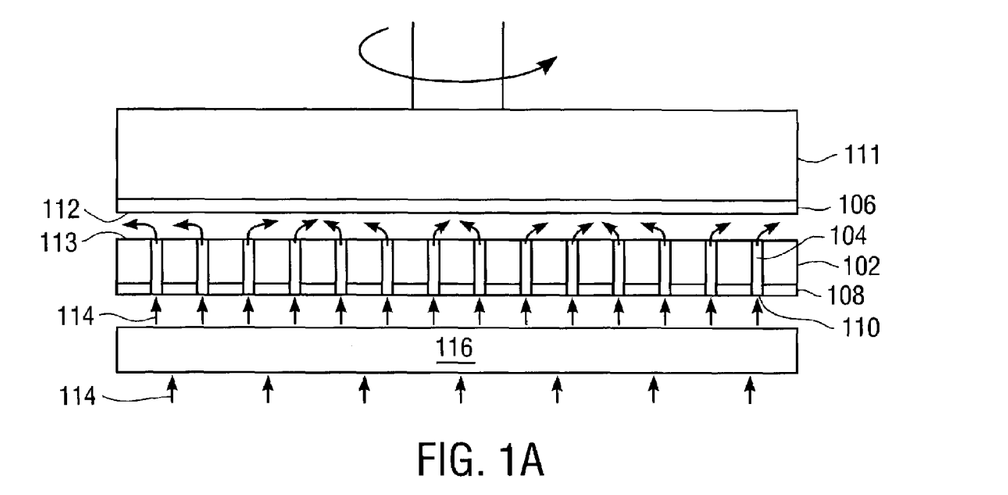
FIG. 1A is schematic illustration of a conventional ECMPR system.

FIG. 1A, is a schematic illustration of an exemplary conventional ECMPR system 100 used for processing wafers. In FIG. 1A, a WSID 102 having openings 104 in it, is disposed in close proximity of a workpiece or wafer 106 to be processed. The WSID 102 is supported by a support plate 108 having perforations 110 or openings in it. The wafer 106 is a silicon wafer to be plated with a conductive material, preferably copper or a copper alloy. The wafer 106 is retained by a wafer carrier 111 so as to position front surface 112 of the wafer against top surface 113 of the WSID 102. The openings 104 are designed to assure uniform deposition of copper from an electrolyte solution, depicted by arrows 114, onto the front surface 112, or uniform electroetching from the front surface 112. The perforations 110 may or may not exactly match the design of the openings 104. Generally, the openings 104 are designed for uniform deposition, and perforations 110 are such that the electrical field and electrolyte solution pass substantially unhindered to the WSID 102. Therefore, the area of perforations per unit area of the support plate 108 is equal to or larger than the area of the openings per unit area of the WSID 102. The top surface 113 of the WSID 102 facing the front surface 112 of the wafer is used as the sweeper and the WSID 102 itself establishes appropriate electrolyte flow and electric field flow to the front surface 112 for globally uniform deposition or etching. Such an ECMPR system 100 also includes an electrode 116, which is immersed in the electrolyte solution 114. The electrolyte 114 is in fluid communication with the electrode 116 and the front surface 112 of the wafer 106 through the openings 104 in the WSID 102.

The electrode 116 is typically a Cu piece for Cu deposition. It may also be an inert electrode made of, for example, Pt coated Ti. An exemplary copper electrolyte solution may be copper sulfate solution with additives such as accelerators, suppressors, leveler, chloride and such, which are commonly used in the industry. In planar deposition techniques such as ECMD, the leveler is not very necessary since leveling is automatically done by the process. Leveler may be added however, for optimization of other process results such as gap fill etc. The top surface 113 of the WSID 102 sweeps the front surface 112 of the wafer while an electrical potential is established between the electrode 116 and the front surface 112 of the wafer. For deposition of a planar film such as copper, the front surface of the wafer 102 is made more cathodic (negative) compared to the electrode 116, which becomes the anode. For electroetching in the same ECMPR system the wafer surface is made more anodic than the electrode. For chemical etching, chemical etching or etching, no potential difference is applied between the wafer and the electrode.

Figure 1B:
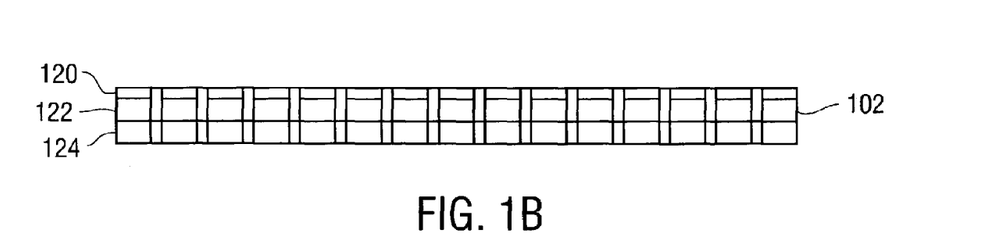
FIG. 1B is a schematic illustration of a workpiece surface influencing device.

As shown in FIG. 1B, the structure of the WSID 102 may have a top layer 120, an intermediate layer 122, and a bottom layer 124. The top layer 120 may preferably be made of an abrasive material such as a the class of fixed-abrasive-films supplied by the 3M company, or any of the other so-called pad materials used in CMP applications, such as the polymeric IC-1000 material supplied by Rodel. The thickness of the top layer 120 may be typically in the range of 0.05–2 mm. The intermediate layer 122 is the mounting layer for the top layer 120 and the holes are defined in the intermediate layer 122 and the bottom layer 124. The intermediate layer 122 is typically made of a hard plastic material such as polycarbonate with a thickness range of 1–3 mm. The bottom layer 124 functions as a compression layer for the whole structure. The bottom layer is made of a polymeric foam material such as polyurethane or polypropylene. U.S. Pat. Nos. 6,413,403 and 6,413,388, which are assigned to the assignee of the present invention, disclose various examples of WSIDs. Further, U.S. application Ser. No. 09/960,236 filed on Sep. 20, 2001, entitled Mask Plate Design, discloses various WSID embodiments. Further, U.S. application Ser. No. 10/155,828 filed on May 23, 2002, entitled Low Force Electrochemical Mechanical Deposition Method and Apparatus, discloses a WSID structure having a flexible and abrasive top layer attached on a highly compressible layer. Both applications are assigned to the assignee of the present invention. The WSID is placed on a porous support plate which may be or may not be an integral part of the WSID. In this particular structure, electrolyte is flowed through the openings or the open pores of the compressible layer and the openings in the flexible layer.

To this end, however, while these techniques assist in obtaining planar metal deposits or novel metal structures on workpieces and wafers, there is still a need for further development of high-throughput approaches and devices that can yield deposits with better uniformity and high yield.

SUMMARY

The present invention provides an apparatus for electrochemical mechanical processing of a surface of a workpiece by utilizing a process solution. The apparatus of the present invention includes an electrode touching the process solution, a belt workpiece surface influencing device extended between and attached to a supply structure and a receiving structure. Further, a process section of the workpiece surface influencing device is disposed in proximity to the surface of the workpiece. The process solution is capable of flowing through the process section and onto the surface of the workpiece. A potential difference is capable of being maintained between the electrode and the surface of the workpiece during the process. A mechanism moves the process section of the workpiece surface influencing device while the solution flows through the workpiece surface influencing device.

Further, the present invention provides a method for electrochemical mechanical processing a surface of a workpiece. The method includes the steps of providing a workpiece surface influencing device having channel pattern. The workpiece surface influencing device is extended between and attached to a supply spool and a receiving spool. The workpiece is placed in close proximity of a first process section of the workpiece surface influencing device. A process solution is flowed through the channels of the first process section of the workpiece surface influencing device and onto the workpiece surface. The surface is electrochemical mechanical processed while establishing relative motion between the first process section of the workpiece surface influencing device and the surface of the workpiece during the electrochemical mechanical processing. During the process, a potential difference is maintained between the electrode and the workpiece.

It is an object of the present invention to provide a belt WSID design that assists in providing metal layers with better uniformity.

It is a further object of the present invention to provide a belt WSID design that have openings or channels grouped in a multiplicity of sections of the belt WSID.

The present invention achieves, either singularly or in combination, these and other objects of the invention using a belt WSID in an electrochemical mechanical processing apparatus.

BRIEF DESCRIPTION OF THE DRAWINGS

FIGS. 10A–12 are schematic illustrations of the belt workpiece surface influencing device systems;

DETAILED DESCRIPTION

The preferred embodiments will now be described using the example of fabricating interconnects for integrated circuit applications. It should, however, be recognized that present invention can be used to operate on any workpiece with various electroplated materials such as Au, Ag, Ni, Pt, Pd, Fe, Sn, Cr, Pb, Zn, Co and their alloys with each other or other materials, for many different applications such as packaging, flat panel displays, magnetic heads and such. In the examples provided below, the example material that is electroplated will be described as copper, but it will be understood that other materials can instead be used.

Further, the preferred embodiment will be described in the context of depositing planar layers. Other novel structures, which may also require electroetching, chemical etching and other processes, as described in the above-mentioned ECMPR patents and applications, can also be obtained using this invention. In one embodiment, for example, a planar conductive layer is formed on a wafer surface by an ECMD process using a belt WSID structure of the present invention. Other structures may also be formed using low-force electrochemical mechanical etching (ECME) as disclosed in previous applications.

Figure 2A:
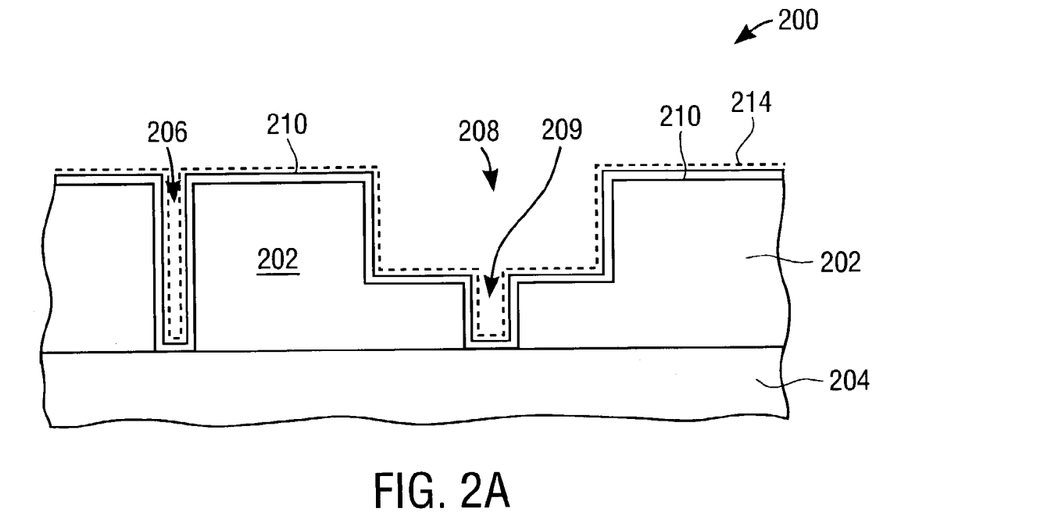
FIG. 2A is a schematic illustration of surface region of a substrate surface having features formed therein.
Figure 2B:
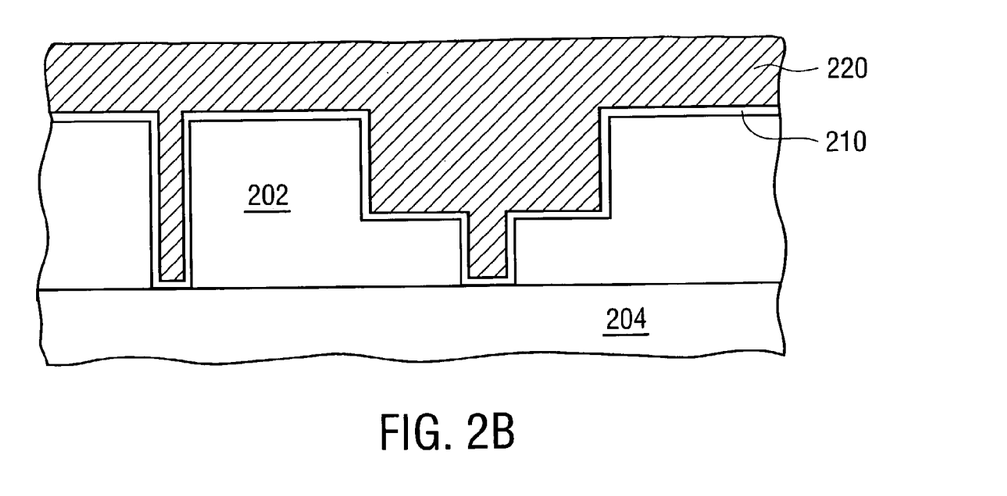
FIG. 2B is a schematic illustration of the substrate shown in FIG. 2A, wherein copper has been deposited on the substrate surface.

Details of the surface region of an exemplary substrate 200 to process with the present invention are shown in FIGS. 2A–2B. The substrate 200 comprises a patterned layer 202, preferably an insulating layer formed on a workpiece 204. The insulating layer may be comprised of an insulation material such as silicon oxide and formed using well-known patterning and etching techniques pursuant to metal interconnect design rules. In this embodiment, the insulating layer 202 may be comprised of cavities or gaps, namely the first cavity 206 and a second cavity 208 separated from one another by field region 210. In this embodiment, the cavities can be formed such that the first cavity 206 may be a via, the second cavity 208 may be a trench including a second via 209 at the bottom. Top surfaces 210 are also called field regions. One or more thin layers of barrier or glue layer 217 having materials, for example, Ta, TaN, Ti, TiN, or WN coats the cavities as well as the top surfaces. A thin film 218 of copper is coated as the seed layer on top of the barrier layer for the subsequent electroplated copper layer. The copper seed layer provides a base layer on which nucleation and growth of the subsequent deposition layer can be promoted. Referring to FIG. 2B, with the present invention, a planar copper layer 220 can be deposited into the cavities 206, 208, 209 and on the field region 210. The deposition process as well as other processes which are performed using the present invention described below.

Figure 3:
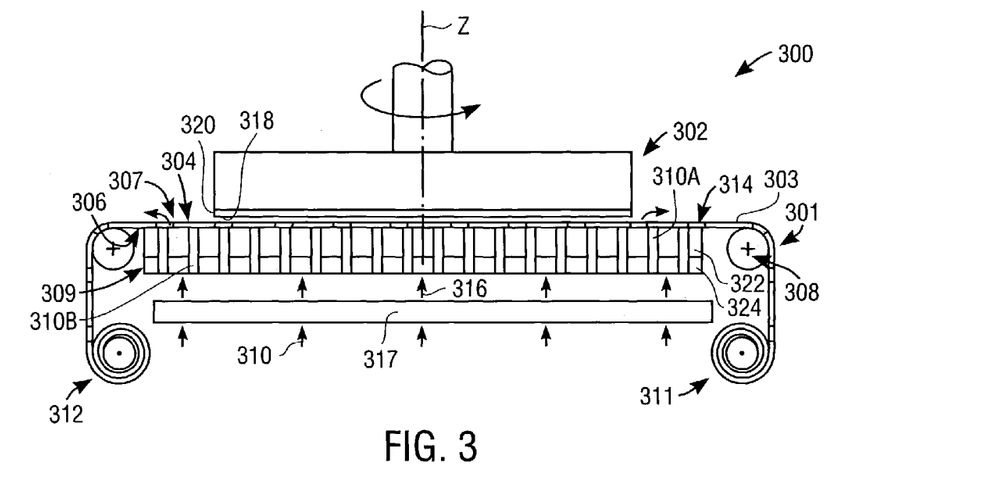
FIG. 3 is a schematic illustration of an ECMPR system employing a belt workpiece surface influencing device.

FIG. 3 shows an embodiment of an ECMPR system 300 comprising a belt WSID assembly 301 of the present invention and a carrier head 302. The belt WSID assembly 301 comprises a WSID belt 303 having an upper surface 304 or a process surface and a back surface 306 and a set of rollers 308. The WSID belt may be made of a flexible material and may preferably have an abrasive process surface for sweeping action. The belt WSID may have a plurality of openings 314 or channels allowing a process solution such as a plating electrolyte or the electroetching solution, depicted by arrows 316, to flow between an electrode 317 and a front surface 318 of a workpiece 320 or a wafer. For clarification purposes, the container or the cavity holding the process solution is not shown in the Figures. The front surface 318 of the wafer may comprise the exemplary substrate shown in FIGS. 2A–2B. As will be described below, the process surface of the belt 303 may also include raised surfaces to perform sweeping action (see FIG. 4B). The belt WSID 303 is moved on the rollers 308 for either in unidirectional or bi-directional linear manner by a moving mechanism (not shown). The belt WSID may be moved during electroetching or electrodeposition process in close proximity of the front surface of the wafer. The belt WSID may be moved on the front surface of the wafer to sweep the front surface during the electroetching or electroplating. The moving mechanism also appropriately tensions the belt WSID 303 to assure contact with the workpiece surface during ECMPR. The back surface 306 of the belt WSID 303 is placed on a top surface 307 of a plate 309. The plate 309 may be comprised of one or more layers. In this embodiment the plate 309 is comprised of an upper layer 322 and a lower layer 324. The upper layer 322 may be made of a compressible material. The bottom layer 324 is a support layer and made of a rigid material so that it can support the compressible layer. Openings 310A in the compressible layer and the openings 310B in the rigid layer allow process solution to flow through the plate 303. Further, the compressible layer 322 may have the openings 310 or may be made of a porous material that allows process solution to flow though its open pores. The belt WSID is tensioned on top surface of the plate so that the top surface 307 of the plate 309 fully contact with a bottom surface portion of the belt WSID that covers the top surface 307. If needed, as the belt WSID moved on the upper layer, the bottom surface of the belt WSID slides on the upper surface of the plate while the process solution 316 flows through both the plate and the belt WSID 303.

The belt WSID may be made of a polymeric film such as a fixed abrasive film commonly used in CMP processes and available from 3M Company. The flexible material of the belt WSID is thin and having a thickness in the range of 0.2–2 mm. The belt WSID may also have a composite structure having multiplicity of thin layers. The belt WSID may have relatively flat, surface such as the lapping films containing 0.05–0.5 micron size abrasive particles (available from e.g. Buehler or 3M companies), or small diameter posts with flat tops or pyramidal posts such as those employed in fixed abrasive pads provided by 3M company. The surface of the belt WSID is preferably abrasive to efficiently sweep the surface of the workpiece.

The upper layer of the plate is made of a foam or gel material, which is easily compressible under an applied force but recovers back to its original shape once the force is removed. The upper layer of the plate may have thickness in the range of 1–5 mm. Examples of such materials can be polyurethane, polypropylene, rubber, EVA, their mixtures and the like. The lower layer of the plate is a porous plate or it has many openings to let electrolyte and electric field freely flow towards the substrate surface. The lower layer 100c may itself be the electrode.

During the process, the wafer 320 is held by the carrier head in close proximity of the belt WSID such that the process solution flowing through the plate 309 and the belt WSID 303 wets the front surface of the wafer. As shown in exploded view in FIG. 4A, the wafer 320 processed over a predetermined area 321 or a process area of the process surface of the belt WSID 303. As the belt is tensioned over the upper surface 307 of the plate, the compressible layer pushes the belt upward. Additionally, if the wafer 320 is contacted with the process surface, the compressible layer pushes the wafer against the front surface of the wafer. The process area 321 is renewed by advancing the belt WSID such that a used process area is replaced by a fresh process area by rolling the used process area over the storage spool 312 and thereby drawing fresh process area from the supply spool 311. Advancement of the belt can be carried out after processing about 20–100 wafers or before the extensive use of the same area of WSID starts impacting the process results in a negative manner. Owing to this feature, the belt WSID 303 reduces manufacturing down time and increases system throughput. Alternately, it is possible to index or gradually advance the WSID by a small amount, such as in the range of 1–5 mm, for each wafer processed. During the process, the wafer carrier 304 can move the wafer on or above the belt WSID 303 laterally and rotate about the rotation axis z of the wafer carrier. As mentioned above, the belt WSID of the present invention can also be moved laterally while the wafer is moved on it by the carrier head. In another embodiment belt may be a loop shape or continuous belt which is rotated by rollers that replace storage and supply spools. Belt is placed around the rollers and tensioned. The rollers in this embodiment are rotated by a drive system and the rotational motion of the rollers cause belt to be moved linearly with respect to the wafer surface that is being processed.

Figure 4A:
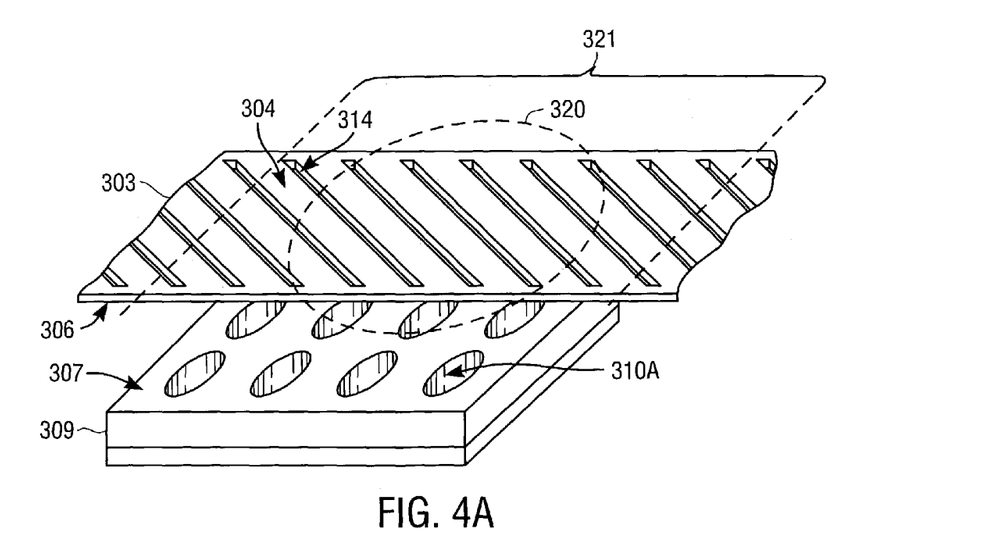
FIG. 4A is a schematic view of a process section of the belt workpiece surface influencing device.
Figure 4B:
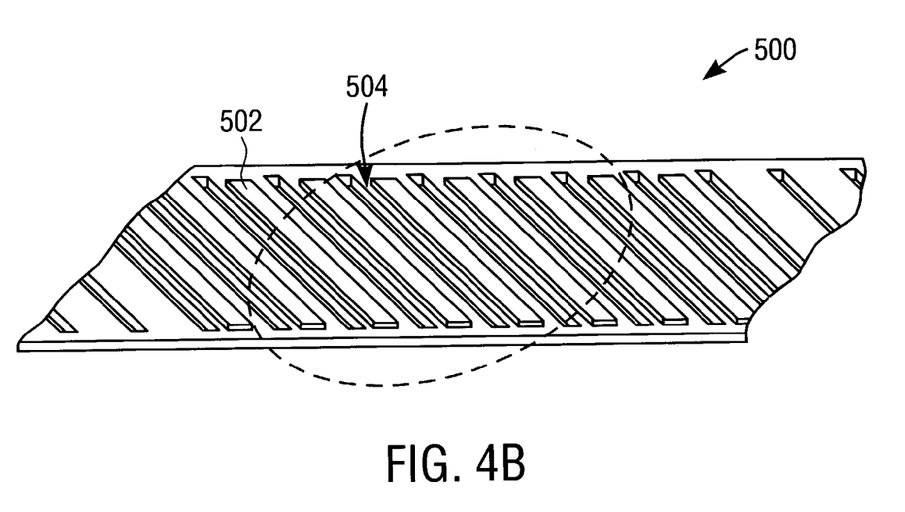
FIG. 4B is a schematic view of a surface of a process section of another belt workpiece surface influencing device.

As also shown in FIG. 4A, width of the belt WSID is preferably shorter than the diameter of the wafer to be processed. As will be described below, this feature of the belt allows electrical contact to be established between the front surface of the wafer and a power source (not shown). For chemical etching processes, width of the WSID may be equal to or larger than the diameter of the wafer, since there is no need to make electrical contact. The belt WSID may be a single layer or a composite layer made up more than one layer. If the belt includes more than one layer, those layers may or may not be the same size. However, the total thickness of such composite layer is typically 0.5–2 mm. As can be seen in FIG. 4B in perspective view, a WSID 500 may have a raised surface 502 which is smaller in comparison to the top surface 504 of the WSID 500. In this embodiment the sweeping function is performed by the raised surface 502. It is preferred that the raised surface 502 contains an abrasive layer.

The exemplary ECMPR system 300 of FIG. 3 is capable of performing planar or non-planar plating as well as planar or non-planar electroetching. In this respect, if non-planar process approach is chosen, the front surface of the wafer is brought into proximity of the process surface of the belt WSID 303, but it does not touch it, so that non-planar metal deposition can be performed. Further, if planar process approach is chosen, the front surface of the wafer contacts the process surface as a relative motion is established between the belt WSID and the front surface of the wafer. As the process solution is delivered through the openings in the belt, either the belt is laterally moved or the wafer is rotated and laterally moved, or both the belt WSID and the wafer are moved, while the front surface contacts the process surface. Under an applied potential between the wafer and the electrode, and in the presence of the process solution that rises through the belt WSID 303, the metal such as copper, is plated on or etched off the front surface of the wafer depending on the polarity of the voltage applied between the wafer surface and the electrode.

Figure 5:
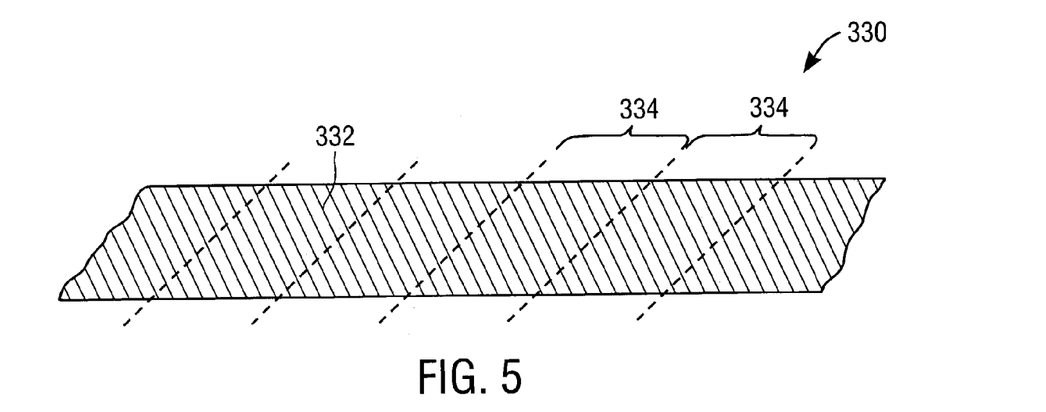
FIG. 5 is a schematic illustration of a workpiece surface influencing device with process sections having the same channel patterns, wherein the process sections are not spaced apart.
Figure 6:
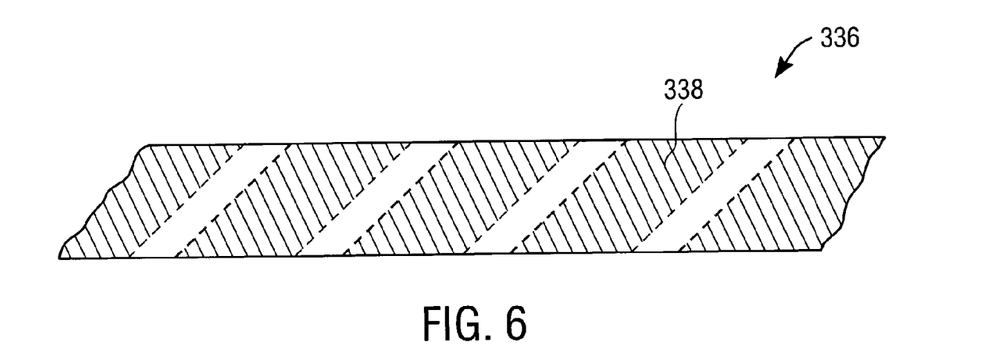
FIG. 6 is a schematic illustration of a workpiece surface influencing device with process sections having the same channel patterns, wherein the process sections are spaced apart.
Figure 7:
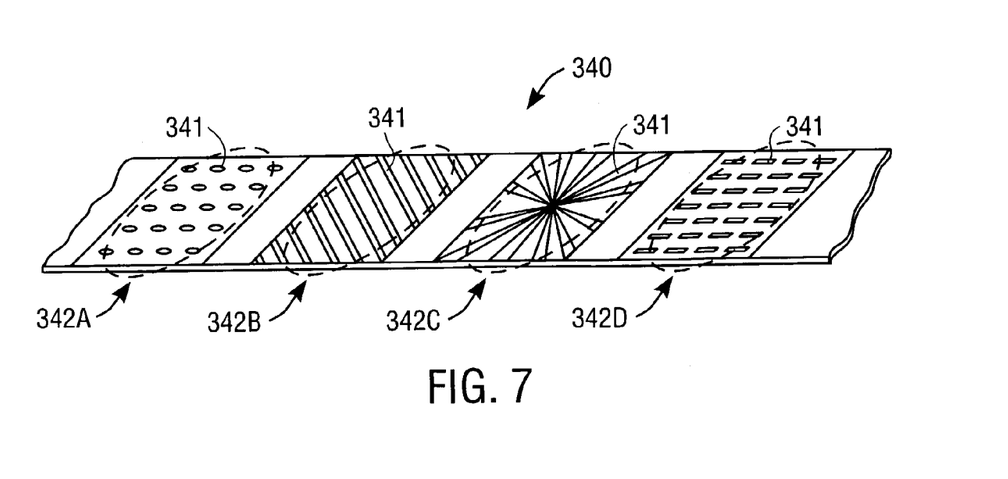
FIG. 7 is a schematic illustration of a workpiece surface influencing device with process sections having different channel patterns.

FIGS. 5 to 7 show various belt WSID process area designs. In accordance of the principles of the present invention, the belt WSID may have various grouped opening or channel patterns which are generally adapted either as a continuous pattern along the belt WSID or more than one pattern repeating along the belt WSID. As shown in FIG. 5, in one embodiment, a WSID belt 330 may have channels 332 which are formed in a continuous pattern extending along the belt WSID 330. In this particular design, channels 332 are shaped as parallel slits, although they may be shaped as holes or other openings in various geometrical shapes, or various radial designs. In this embodiment, depending on the process requirements and the wafer size, a plurality of process areas 334 can be extended end to end fashion. The belt WSID 330 can be moved laterally on the plate for the mechanical sweeping action. After certain number of wafer processing on the same processing area, the belt WSID is advanced to get fresh process area. Alternately the belt can be moved incrementally in a specific direction during processing. This way an incremental fresh belt WSID portion is moved into the process area in a continuous manner.

As shown in another embodiment in FIG. 6, a belt WSID 336 may have channels 338 that are grouped in process areas 338 that are separated from one another. After each use the process areas are advanced to replace them with the new ones. With such belt, the lateral motion is mainly provided by the wafer holder during the process.

Although the belt WSID may have a single channel pattern extending along the belt WSID, such as those shown in FIGS. 5 and 6, the belt WSID may also comprise a multiplicity of opening or channel patterns. As exemplified in FIG. 7, a belt WSID 340 may have a number of process areas 342A–342D that comprise channels 344, having different sizes and shapes, as well as raised surfaces on the process areas for the sweeping action. For example, the process area 342A comprises channels 344 shaped as round holes while the process area 342B comprises channels 344 shaped as slits. The process area 342C comprises channels 344 having a radial pattern, and the process area 342D comprises channels 344 formed as rectangular holes. Channels 344 in each process area 342A–342D may also differ in size and shape as well as in how they are distributed on that particular process area. Each process area may be repeatedly used for ECMD or ECME or chemical etching process purposes by advancing or recoiling the belt WSID for the particular process area. By giving a specific shape and distribution to the channels, the copper layer profile can be controlled. By employing a specific process area, the thickness profile of the copper layer can be made uniform or can be varied into a desired profile. For example, in an exemplary operation sequence, the wafer may be first ECMD processed on the process area 342A to deposit a planar copper layer. Subsequently, the same wafer may be ECME processed or chemically mechanically etched to etch back the planar copper layer on the process area 342B. In this example, the process area 342A may have a channel pattern that is suitable for ECMD process giving uniform deposition, and the process area 342B may have a pattern that is suitable for ECME or CME or chemical etching processes, yielding uniform material etching or removal.

Figure 8:
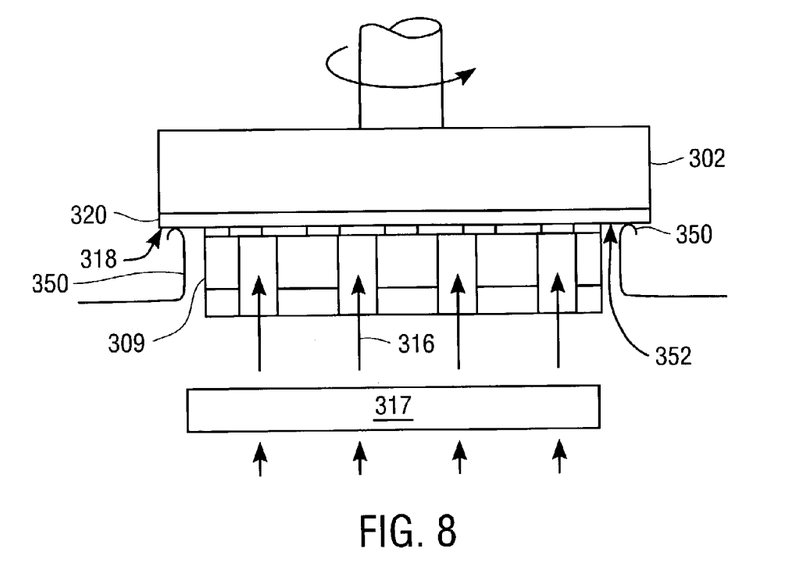
FIG. 8 is a schematic illustration of electrical contact locations in the ECMPR system shown in FIG. 3.

During the ECMPR an electrical potential is established between the front surface of the wafer and the electrode 317. As shown in FIG. 8 in a side view of the system 300, the front surface of the wafer 320 is connected to a power source (not shown) through contacts 350 touching and sliding on a peripheral region 352 of the front surface 318 of the wafer. Examples of such contacts are described in U.S. application Ser. No. 09/760,757 entitled Method and Apparatus for Electrodeposition of Uniform Film with Minimal Edge Exclusion on Substrate, filed on Jan. 17, 2001 and U.S. Provisional Application No. 60/348,758, entitled "Method and System for Providing Electrical Contacts for Electrotreating Processes filed on Oct. 26, 2001, both are commonly owned by the assignee of the present invention.

Figure 9:
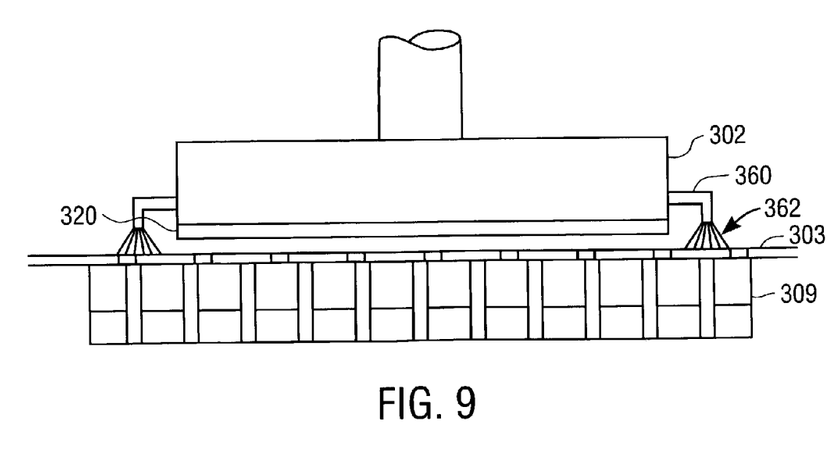
FIG. 9 is a schematic illustration of a conditioning device of the belt workpiece surface influencing device of the present invention.

During the process step that involves the WSID being in close proximity to, and typically in contact with, the front surface of the wafer, small particles of the metal on the front surface or the non-conductive particles from the sources may attach onto the WSID material. These particles may exist because of the fact that they may be just physically removed from the substrate surface or they may originate from the plating solution due to poor filtration of the plating solution. Such particles can be cleaned using the conditioning apparatus of the present invention. As shown in FIG. 9, the carrier head 302 may include a conditioning apparatus 360 with brushes 362. As illustrated, the brushes 362 are disposed around the periphery of the carrier head 302. The brushes 362 provide for conditioning of the WSID 303 by dislodging particles by mechanically sweeping them out. In this embodiment, the ECMPR process on the workpiece 320, whether ECMD or ECME, and conditioning of the WSID 303 can occur at the same time, during the same process. In this particular situation, in order to condition the entire WSID 303, the lateral movement of the carrier head 302 or the WSID 303 should preferably be equal or greater than the radius of the carrier head 302 so that the WSID portion that the carrier head covers can effectively be cleaned. Alternately the conditioning brushes are not attached to the head but they are placed, using suitable means, out of end of an area that is scanned by the lateral movement of the head. The belt may then be moved to assure that the entire length of the processing area is brushed by the conditioning brushes.

Figure 10A:
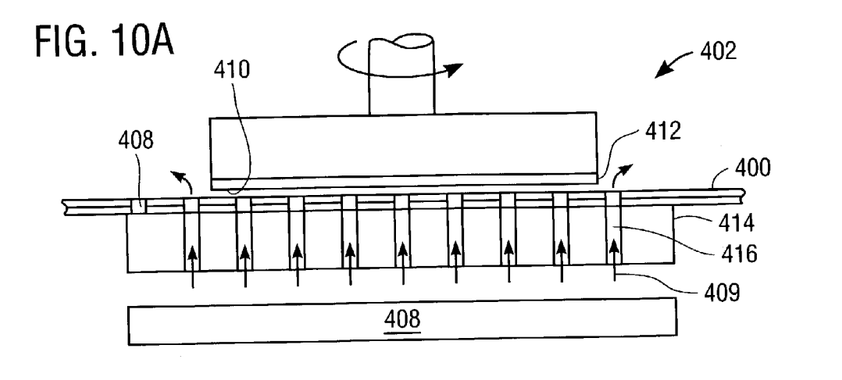
Figure 10B:
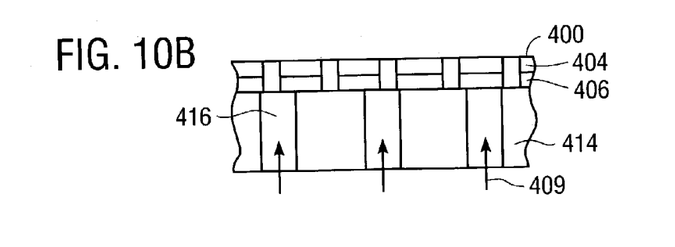

FIGS. 10A–12 shows various embodiments of the belt WSID. FIG. 10A shows a belt WSID 400 in an ECMPR system 402. As shown in detail in FIG. 10B, the belt WSID 400 is comprised of a bi-layer with a top layer 404 and a bottom layer 406 attached to the top layer. The top layer 404 may be an abrasive layer or a layer containing abrasives. The bottom layer 406 is a thin compressible layer. Channels 408 are formed through the belt 400 to allow a process solution 407 to flow through between an electrode 408 and a front surface 410 of a wafer 412. Referring to FIG. 10A, in use, the compressible layer of the belt 402 is placed on a plate 414 of the system 402. The plate in this embodiment preferably made of a rigid material. The plate comprises channels 416 to allow process solution to flow through the plate. During the process the compressible layer of the belt, which is supported by the rigid plate of the system, pushes the belt towards the wafer. In this embodiment, apart from the previous embodiment, the compressible layer is an integral part of the belt WSID. The surface interface between the compressible layer and the plate 414 is preferably a low friction interface in this example and the previous examples. For the belt described above embodiment, the top layer is typically 0.2–2 mm thick and the bottom layer is typically 1–5 mm thick, which layers are glued together, with the channels dimensioned to allow fluid flow therethrough.

Figure 11A:
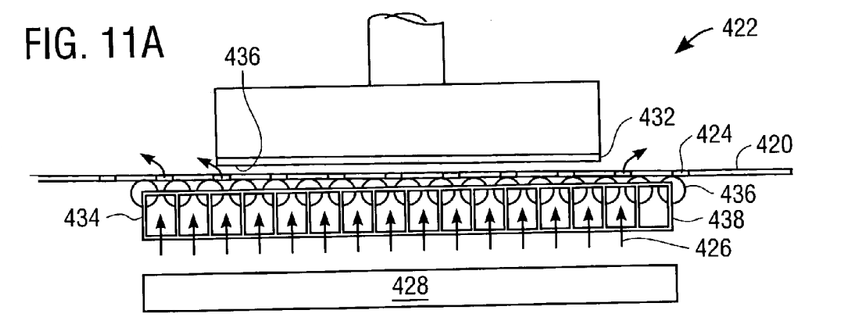
Figure 11B:
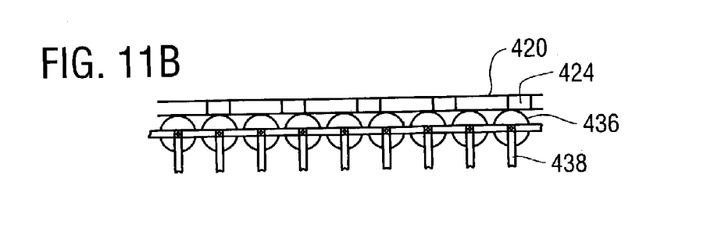

FIG. 11A shows a belt WSID 420 in an ECMPR system 422. As shown in detail in FIG. 11B, the belt WSID 420 is comprised of a single layer which may be an abrasive layer or a layer containing abrasives. Channels 424 are formed through the belt 420 to allow a process solution 426 to flow through between an electrode 428 and a front surface 430 of a wafer 432. Referring to FIG. 11A, in use, the belt 302 is placed on a roller system 434 having a plurality of rollers 436 placed on a frame 438. The frame is immersed in the process solution and allow the passage of the process solution through the roller system. Rollers are placed side by side along the width of the belt and they are able to move up and down when the wafer contacts the belt during the process. During the process roller system pushes the belt against the wafer and acts like a compressible layer shown in the previous embodiments. Roller surfaces may preferably contain a compressible material to establish contact between the wafer surface and the belt surface.

Figure 12:
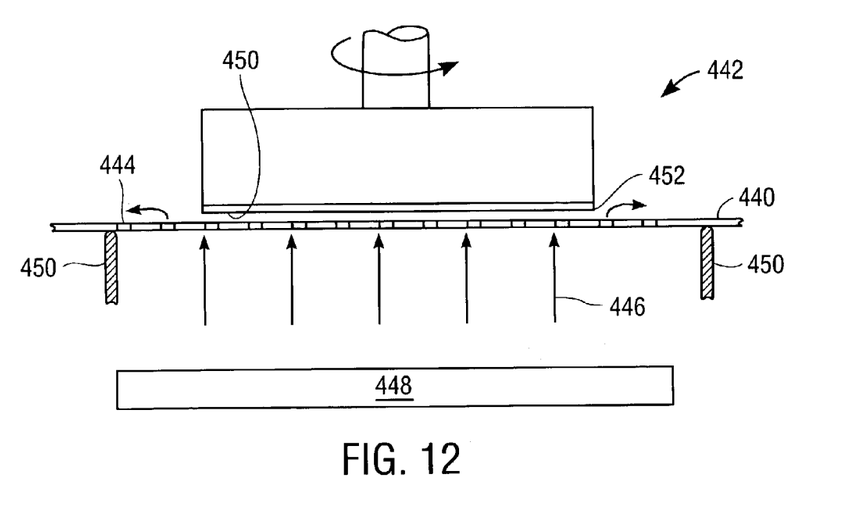
Figure 13A:
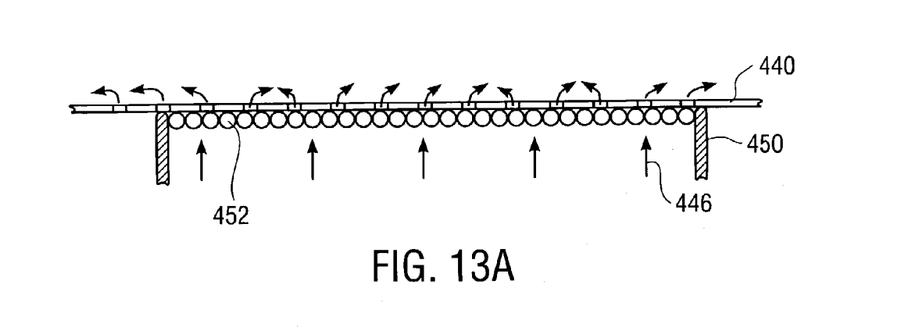
FIGS. 13A–13C are schematic illustrations of alternative belt support means.
Figure 13B:
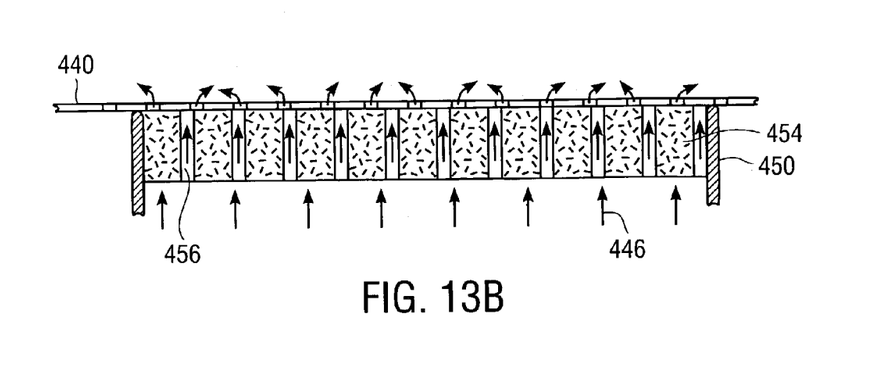
Figure 13C:
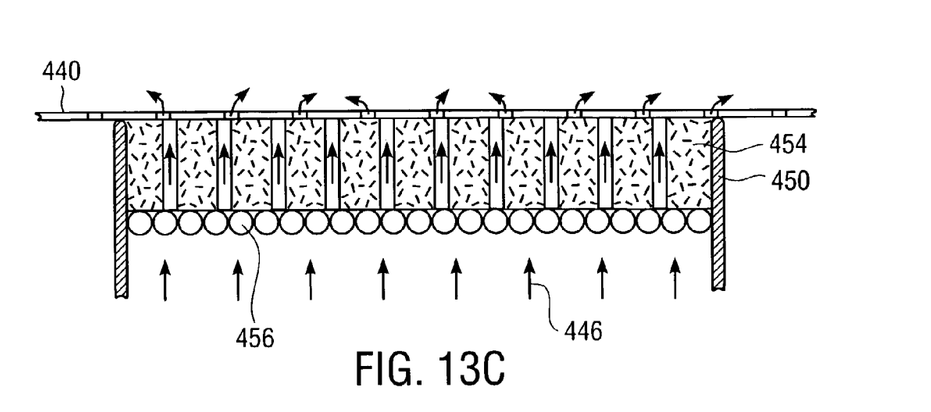

FIG. 12 shows a belt WSID 440 in a ECMPR system 442. The belt WSID 440 is comprised of a single layer that may be an abrasive layer or a layer containing abrasives. Channels 444 are formed through the belt 440 to allow a process solution 446 to flow through between an electrode 428 and a front surface 430 of a wafer 432. The process solution is held in a container (not shown). The belt is supported on top ends 450 of side walls the container during the process. In addition to that, the flow pressure of the process solution process pushes the belt against the wafer while providing additional support. Pressure of the solution acts like a compressible layer shown in the previous embodiments FIGS. 13A–13C illustrate various additional mechanisms to support the belt 440 that is shown in the embodiment described with help of FIG. 12. As shown in FIG. 13A, the belt WSID 440 may also be supported by a plurality of hollow spheres 452 located under the belt 440 and floating on the process solution 446 while confined by the wall tops 450 of the process container. The spheres may be filled with a gas such as air or a lighter gas. In addition to the pressure of the solution, spheres 452 adds an additional compressible support to the belt.

In FIG. 13B, the same can be achieved using a floatable layer 454, placed under the belt 440, having channels 456 to allow process solution 446 to flow through it. The floatable layer 454 may be made of a sponge like material such polyurethane. The floatable layer may also have air pockets (not shown) in it. Further, as illustrated in FIG. 13C, both the floatable layer 454 and the spheres 452 are placed under the belt 440 for the same purpose.

Figure 14A:
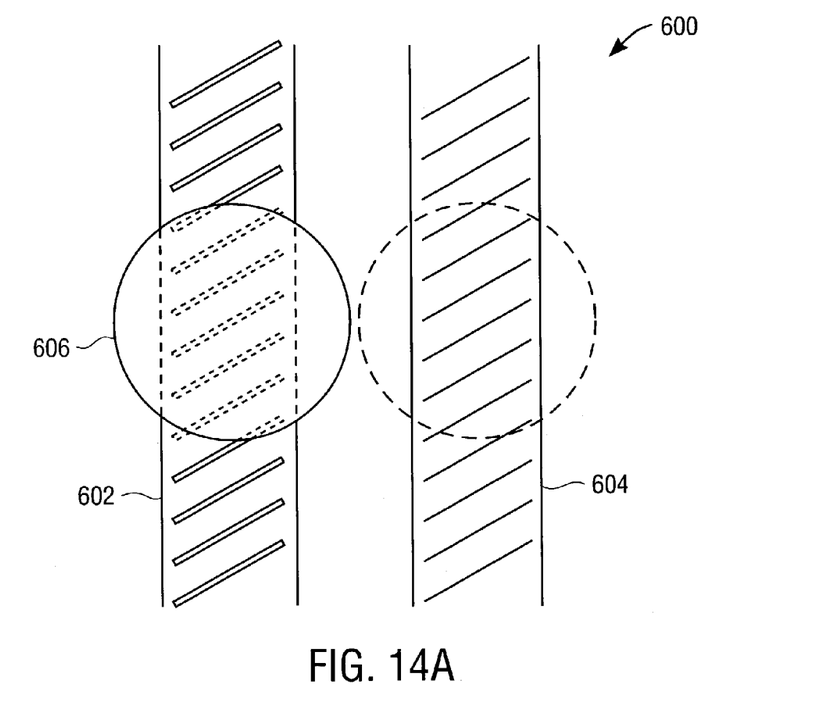
FIGS. 14A–14B is a schematic illustrations of a multiple workpiece surface influencing device system.
Figure 14B:
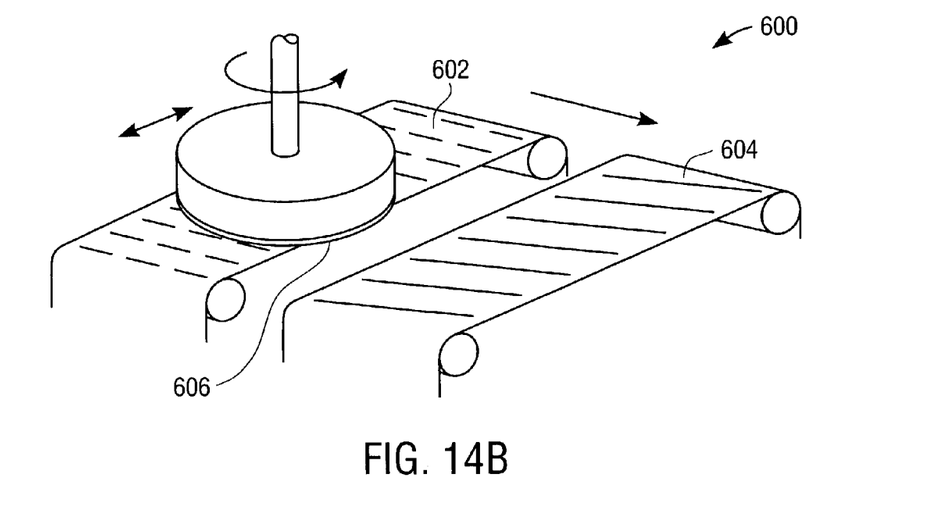

FIGS. 14A and 14B show a multiple WSID system 600 comprising a first belt WSID 602 and a second belt WSID 604 which is located adjacent the first belt WSID. The system 600 may have more than two WSID belts if needed. The system 600 allows a wafer 606 to be processed on both belts 602 and 604 during the process. The belts 602, 604 may have the repeating channel patterns shown in FIGS. 5 and 6. The belts may also have different channel patterns designed for different thickness distributions. For example, a first step of the process can be done using ECMD on the first belt 602 in a way that yields edge thick deposit profile. Then, the belt 604 can be used for an ECME step to reduce the overall thickness of the deposit. The pattern of the belt 604 may be such that more material can be etched from the edge portions to yield uniform thickness profile. If needed process may be continued on the first belt and vice versa.

Although various preferred embodiments have been described in detail above, those skilled in the art will readily appreciate that many modifications of the exemplary embodiment are possible without materially departing from the novel teachings and advantages of this invention.

The invention claimed is:

1. An apparatus for electrochemical mechanical processing of a surface of workpiece by utilizing a solution comprising:
    an electrode touching the solution;
    a workpiece surface influencing device extended between and attached to a supply structure and a receiving structure, a section of the workpiece surface influencing device disposed in proximity to the surface of the workpiece, wherein the solution flows through openings in the section of the workpiece surface influencing device and onto the surface of the workpiece and a potential difference is maintained between the electrode and the surface of the workpiece, wherein the workpiece surface influencing device is shaped as a belt and wherein the openings are channels; and
    a mechanism for linearly moving the section of the workpiece surface influencing device while the solution flows therethrough.

2. An apparatus for electrochemical mechanical processing of a surface of workpiece by utilizing a solution comprising:
    an electrode touching the solution;
    a workpiece surface influencing device extended between and attached to a supply structure and a receiving structure, a section of the workpiece surface influencing device disposed in proximity to the surface of the workpiece, wherein the solution flows through openings in the section of the workpiece surface influencing device and onto the surface of the workpiece and a potential difference is maintained between the electrode and the surface of the workpiece, wherein the workpiece surface influencing device is shaped as a belt, wherein the workpiece surface influencing device comprises a flexible layer having a top and bottom surfaces, and wherein the top surface faces the surface of the workpiece; and
    a mechanism for linearly moving the section of the workpiece surface influencing device while the solution flows therethrough.

3. The apparatus of claim 2, wherein the top surface of the flexible layer comprises abrasive particles.

4. The apparatus of claim 2, further comprising a support structure to support the workpiece surface influencing device.

5. The apparatus of claim 4, wherein the workpiece surface influencing device comprises a compressible layer placed under the bottom surface of the flexible layer.

6. The apparatus of claim 5, wherein the compressible layer is attached to the bottom of the flexible layer so that the compressible layer can be moved on the support structure.

7. The apparatus of claim 5, wherein the compressible layer is attached to a top surface of the support structure so that the flexible layer can be moved on the compressible layer.

8. The apparatus of claim 4, wherein the support structure is a support layer.

9. The apparatus of claim 2, wherein the section of the workpiece surface influencing device is disposed to contact a front substantially planar conductive surface of the workpiece during at least some of the electrochemical mechanical processing.

10. The apparatus of claim 9, further comprising a support means to support the workpiece surface influencing device.

11. The apparatus of claim 10 wherein the support means is solution pressure applied under the workpiece surface influencing device.

12. An apparatus for electrochemical mechanical processing of a surface of workpiece by utilizing a solution comprising:
    an electrode touching the solution;
    a workpiece surface influencing device extended between and attached to a supply structure and a receiving structure, a section of the workpiece surface influencing device disposed in proximity to the surface of the workpiece, wherein the solution flows through openings in the section of the workpiece surface influencing device and onto the surface of the workpiece and a potential difference is maintained between the electrode and the surface of the workpiece; and
    a mechanism for linearly moving the section of the workpiece surface influencing device while the solution flows therethiough, wherein when processing a plurality of workpieces the section of the workpiece surface influencing device is advanced between process intervals by the moving mechanism to bring the another section of the workpiece surface influencing device in proximity to the surface of the workpiece.

13. The apparatus of claim 12, wherein the section and the another section have the same channel pattern.

14. The apparatus of claim 13, wherein a first plurality of workpieces is processed on the section during a first process interval and then a second plurality of workpieces is processed on the another section during a second process interval.

15. The apparatus of claim 12, wherein the section and the another section have different channel patterns.

16. An apparatus for electrochemical mechanical processing of a surface of workpiece by utilizing a solution comprising:
   an electrode touching the solution;
   a workpiece surface influencing device extended between and attached to a supply structure and a receiving structure, a section of the workpiece surface influencing device disposed in proximity to the surface of the workpiece, wherein the solution flows through openings in the section of the workpiece surface influencing device and onto the surface of the workpiece and a potential difference is maintained between the electrode and the surface of the workpiece, wherein the potential difference applied provides for electropolishing; and
   a mechanism for linearly moving the section of the workpiece surface influencing device while the solution flows therethrough.

17. An apparatus for electrochemical mechanical processing of a surface of a workpiece by utilizing a first solution and a second solution comprising:
   an electrode touching the solutions;
   a first workpiece surface influencing device extended between and attached to a first supply structure and a first receiving structure;
   a second workpiece surface influencing device extended between and attached to a second supply structure and a second receiving structure;
   a first mechanism for moving a first section of the first workpiece surface influencing device;
   a second mechanism for moving a first section of the second workpiece surface influencing device; and
   means for flowing the first and second solutions, respectively, through the first sections of the first and second workpiece surface influencing devices;
   wherein the surface of the workpiece is electrochemically mechanically processed on the first and second workpiece surface influencing devices while the respective first and second solutions flow through the first sections of the workpiece surface influencing devices and onto the surface of the workpiece and wherein a potential difference is capable of being maintained between the electrode and the surface of the workpiece.

18. The apparatus according to claim 17, wherein the means for flowing flows first and second solutions that are different from one another.

19. The apparatus according to claim 17, wherein the means for flowing flows first and second solutions that are the same.

20. A method for electrochemical mechanical processing a surface of a workpiece, the method comprising the steps of:
   providing a workpiece surface influencing device which is extended between and attached to a supply structure and a receiving structure;
   placing the surface of the workpiece in close proximity of a first process section of the workpiece surface influencing device having channel patterns;
   flowing a solution through the channels of the first process section of the workpiece surface influencing device and onto the surface of the workpiece;
   electrochemically mechanically processing the surface of the workpiece when applying a potential difference between an electrode touching the solution and the workpiece; and
   linearly moving the first process section of the workpiece surface influencing device over the surface of the workpiece during the electrochemical mechanical processing.

21. The method of claim 20, wherein a moving mechanism moves the workpiece surface influencing device in bi-directional linear manner.

22. The method of claim 21, further comprising advancing the workpiece surface influencing device during the process by the moving mechanism to bring an unused portion of the workpiece surface influencing device in proximity to the surface of the workpiece.

23. The method of claim 20, wherein a moving mechanism moves the workpiece surface influencing device in unidirectional linear manner.

24. The method of claim 20, further comprising advancing a first process section of the workpiece surface influencing device between process intervals to bring a second process section of the workpiece surface influencing device in proximity to the surface of the workpiece.

25. The method of claim 24, wherein the first and the second process sections have the same channel pattern.

26. The method of claim 24, wherein the first and the second process sections have different channel patterns.

27. The method of claim 26, further comprising processing a first plurality of workpieces on the first process section during a first process interval and then processing a second plurality of workpieces on the second process section during a second process interval.

28. The method of claim 27, wherein the process performed on the first process section is electrochemical mechanical deposition.

29. The method of claim 27, wherein the process performed on the second process section is electrochemical mechanical polishing.

30. The method of claim 24, further comprising processing a first plurality of workpieces on the first process section during a first process interval and then processing a second plurality of workpieces on the second process section during a second process interval.

31. The process of claim 30, wherein the process performed on the first process section is electrochemical mechanical deposition.

32. The process of claim 31, wherein the process performed on the second process section is electrochemical mechanical polishing.

33. The process of claim 30, wherein the process performed on the first and second process sections is electrochemical mechanical deposition.

34. The process of claim 30, wherein the process performed on the first and second process sections is electrochemical mechanical polishing.

35. The method of claim 20, wherein the electrochemical mechanical processing is electrochemical mechanical deposition.

36. The method of claim 20, wherein the electrochemical mechanical processing is electrochemical mechanical polishing.

37. A method for electrochemical mechanical processing a surface of a plurality of workpieces using a solution, the method comprising the steps of:
provising a workpiece surface influencing device which is extended between and attached to a supply structure and a receiving structure;
electrochemically mechanically processing the surface of a first plurality of the plurality of workpieces when applying a potential difference between an electrode touching the solution and each of the first plurality of workpieces and using a first process section of the workpiece surface influencing device;
moving the workpiece surface influencing device so that a second process section of the workpiece surface influencing device can be used; and
electrochemically mechanically processing the surface of a second plurality of the plurality of workpieces when applying the potential difference between the electrode touching the solution and each of the second plurality of workpieces and using the second process section of the workpiece surface influencing device.

38. The method of claim 37, wherein the first and the second process sections having the same channel pattern.

39. The process of claim 38, wherein the process performed on the first process section is electrochemical mechanical deposition.

40. The process of claim 39, wherein the process performed on the second process section is electrochemical mechanical polishing.

41. The method of claim 37, wherein the first and the second process sections have different channel patterns.

42. The process of claim 41, wherein the process performed on the first process section is electrochemical mechanical deposition.

43. The process of claim 42, wherein the process performed on the second process section is electrochemical mechanical polishing.

44. The process of claim 37, wherein the process performed on the first and second process sections is electrochemical mechanical deposition.

45. The process of claim 37, wherein the process performed on the first and second process sections is electrochemical mechanical polishing.

* * * * *